(12) United States Patent
Collier et al.

(10) Patent No.: US 6,732,318 B2
(45) Date of Patent: May 4, 2004

(54) VARIABLE WIDTH PARALLEL CYCLICAL REDUNDANCY CHECK

(75) Inventors: Josh D. Collier, Winchester, MA (US); Ryan P. Abraham, West Townsend, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 521 days.

(21) Appl. No.: 09/825,177

(22) Filed: Apr. 3, 2001

(65) Prior Publication Data

US 2003/0023921 A1 Jan. 30, 2003

(51) Int. Cl.[7] .............................................. H03M 13/00
(52) U.S. Cl. ....................................................... 714/758
(58) Field of Search ................................ 714/758, 752, 714/781

(56) References Cited

FOREIGN PATENT DOCUMENTS

EP         0936537        8/1999    ............. G06F/9/30

OTHER PUBLICATIONS

InfiniBand™ Architecture Tutorial, Aug. 2000, pp. 1–144.
A Painless Guide to CRC Error Detection Algorithms Index V3.00, Sep. 24, 1996, pp.1–33.
InfiniBand™ Architecture Specification vol. 1, Release 0.9, Mar. 31, 2000, Published by InfiniBand[SM] Trade Association.
InfiniBand™ Architecture Specification vol. 2A, Release 0.9, Apr. 7, 2000, Published by InfiniBand[SM] Trade Association.

*Primary Examiner*—Albert Decady
*Assistant Examiner*—Esaw Abraham

(57) ABSTRACT

Apparatus and method for generating and checking a cyclical redundancy check value wherein a first device calculates a cyclical redundancy check value on a full set of bits of input data to produce a first value and a second device calculates a cyclical redundancy check value on a subset of the full set of bits of input data to produce a second value. One of the values is selected for transmission to a register. The value in the register is fed back to the devices for iterating the cyclical redundancy check value calculation until it has been completed. For checking a cyclical redundancy check value, a comparator compares a calculated, cyclical redundancy check value with the received cyclical redundancy check value or with a constant

20 Claims, 7 Drawing Sheets

VARIABLE WIDTH PARALLEL CYCLICAL REDUNDANCY CHECK

TECHNICAL FIELD

The present invention relates to cyclical redundancy checking and, in particular, to an apparatus and method for producing a variable width parallel cyclical redundancy check for use where link width may or may not correspond to CRC calculation width.

BACKGROUND ART

A cyclic redundancy check ("CRC") is a method of detecting changes and error in blocks of data that have been transferred or stored. Generally, a CRC is a mathematical algorithm that acts on a block of data. The CRC divides the block of data by a particular number which is referred to as the "CRC polynomial" or the "generator polynomial" and leaves a remainder, referred to herein as the cyclic redundancy check value. Usually, this CRC value is transferred with the data, and when the data is received or recovered from storage, another division is performed and the remainder from the second division is compared to the remainder sent or stored with the data. If the received data has been changed, the remainders will not be the same. Upon detecting this difference, the receiver may request that the data be resent.

Many different CRC polynomials are in use, and the length of the polynomial determines the length of the CRC value. For example, a 16-bit polynomial will produce a 16 bit CRC value. In fact, the most important distinction between polynomials may be their length. Long polynomials ensure greater data accuracy, are usable over larger amounts of data, and are more likely to detect errors in the data transmission than short polynomials.

A CRC uses modulo two arithmetic to produce its CRC value This is a digital form of division that is fast and easy to implement. A polynomial division modulo two is similar to binary division and is implemented through the use of a register having the same length as the CRC value produced by the division. The register is used to compute the CRC value and store it, at least temporarily, after computation. The register is usually cleared before the division is performed and then initialized to all ones to prevents errors caused by extraneous zeros that may or may not be detected by the CRC check.

SUMMARY OF THE INVENTION

An apparatus for generating a cyclical redundancy check value for a variable number of input data bits is provided. The apparatus includes at least a first device for calculating a cyclical redundancy check value on a full set of bits of input data and producing a first value and a second device for calculating a cyclical redundancy check value on a first subset of the full set of bits of input data and producing a second value. A multiplexer, coupled to the first and second devices, receives the first and second values and a selection input to the multiplexer selects one of the values for further transmission. The apparatus also includes a register having an input coupled to the output of the multiplexer. A second multiplexer can be coupled between the first multiplexer and the register for selecting the selected value from the first multiplexer or the output from the register for input to the register. The output from the register may be fed back to the first and second devices through a logic gate which selects an initialization input for the initial input bits and thereafter selects the output value from the register. By adding a checker to the apparatus, it becomes suitable for checking a cyclical redundancy check value. The checker compares a cyclical redundancy value from within the input data with the output value from the register or in accordance with an alternative embodiment compares the output value from the register with a constant.

A method receives a variable number of input data bits and generates a cyclical redundancy check value. A cyclical redundancy check value is calculated for a total number of bits to produce a first calculated value. A cyclical redundancy check value is calculated for a first subset of the total bits to produce a second calculated value. One of the calculated values is selected and transmitted to a register. For checking a received cyclical redundancy check value, the data except for the received cyclical redundancy check value can be used to generate a cyclical redundancy check value for comparison with the received cyclical redundancy check value. Alternatively, a cyclical redundancy check value is calculated for the input bits including their received cyclical redundancy check value and the result is compared with a constant.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

Figure 1A:
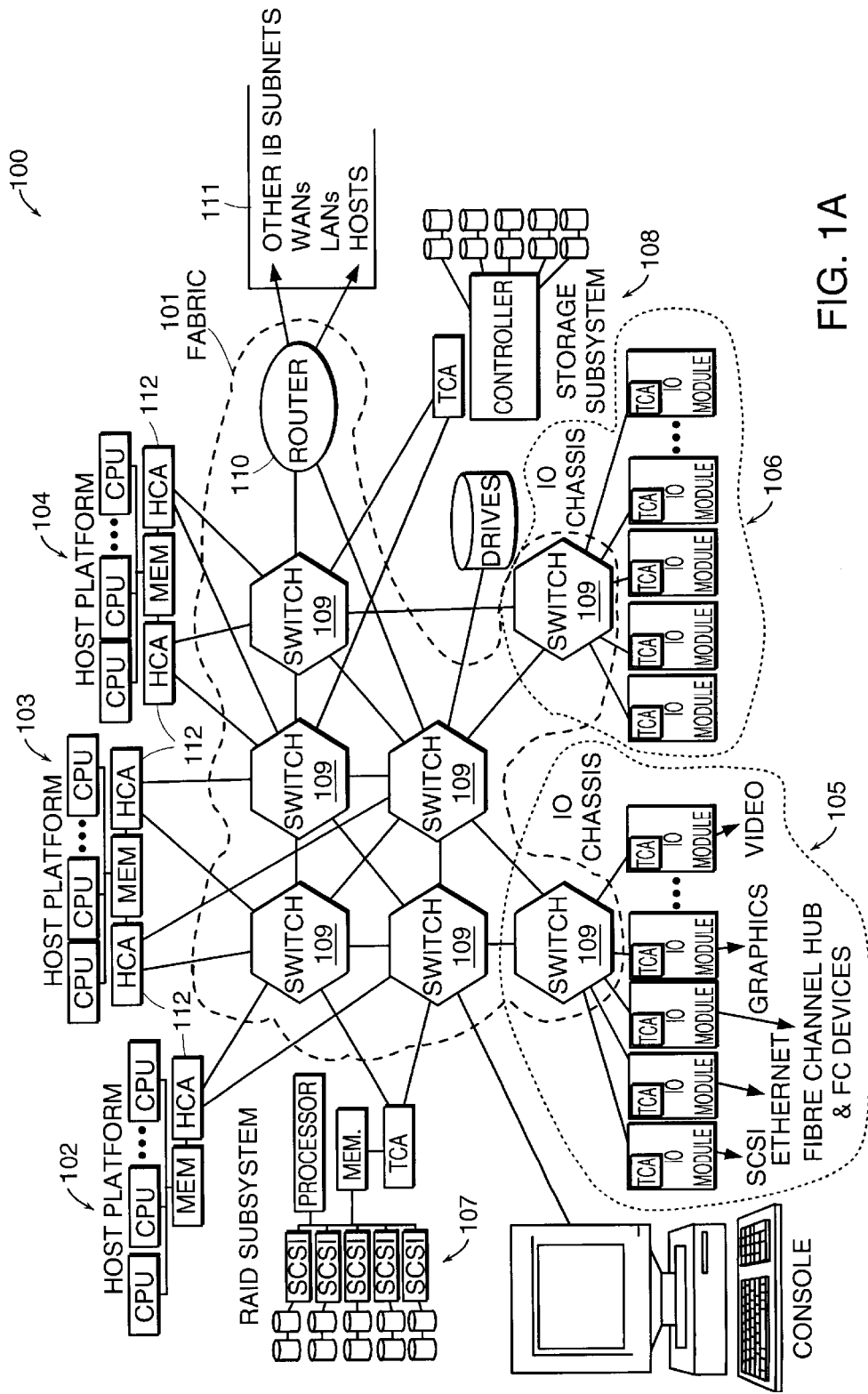
FIG. 1(a) is a block diagram illustrating a system in which the embodiments of the invention may be employed.

In FIG. 1(a) is shown the type of system in which the embodiments of the invention herein described may be employed. Such a system or network is the Infiniband Architecture developed by the Infiniband Trade Association, the specification for which is incorporated herein by reference. The Infiniband Architecture defines a system area network for connecting multiple independent processor platforms (i.e., host processor nodes), input/output ("IO") platforms, and IO devices. The system can range from a small server with one processor and a few IO devices to a massively parallel supercomputer installation with hundreds of processors and thousands of IO devices. In addition, the architecture allows bridging to an Internet, intranet, or connection to remote computer systems 111.

The Infiniband architecture defines a switched communications fabric 101 that allows many devices to communicate concurrently. The fabric is made up of cascaded switches 109 and routers 110. Processor nodes 102, 103, and 104 and IO units 105, 106, 107, and 108 are connected through the fabric 101. IO units can range in complexity from a single attached device, such as a SCSI or LAN adapter to large, memory rich RAI) subsystems 107.

The foundation of the Infiniband operation is the ability of a client process to queue up a set of instructions that hardware devices, such as a channel adapters 112, switches 109, or routers 110 execute. This facility is referred to as a work queue. Work queues are always created in pairs consisting of a send work queue and a receive work queue.

Figure 1B:
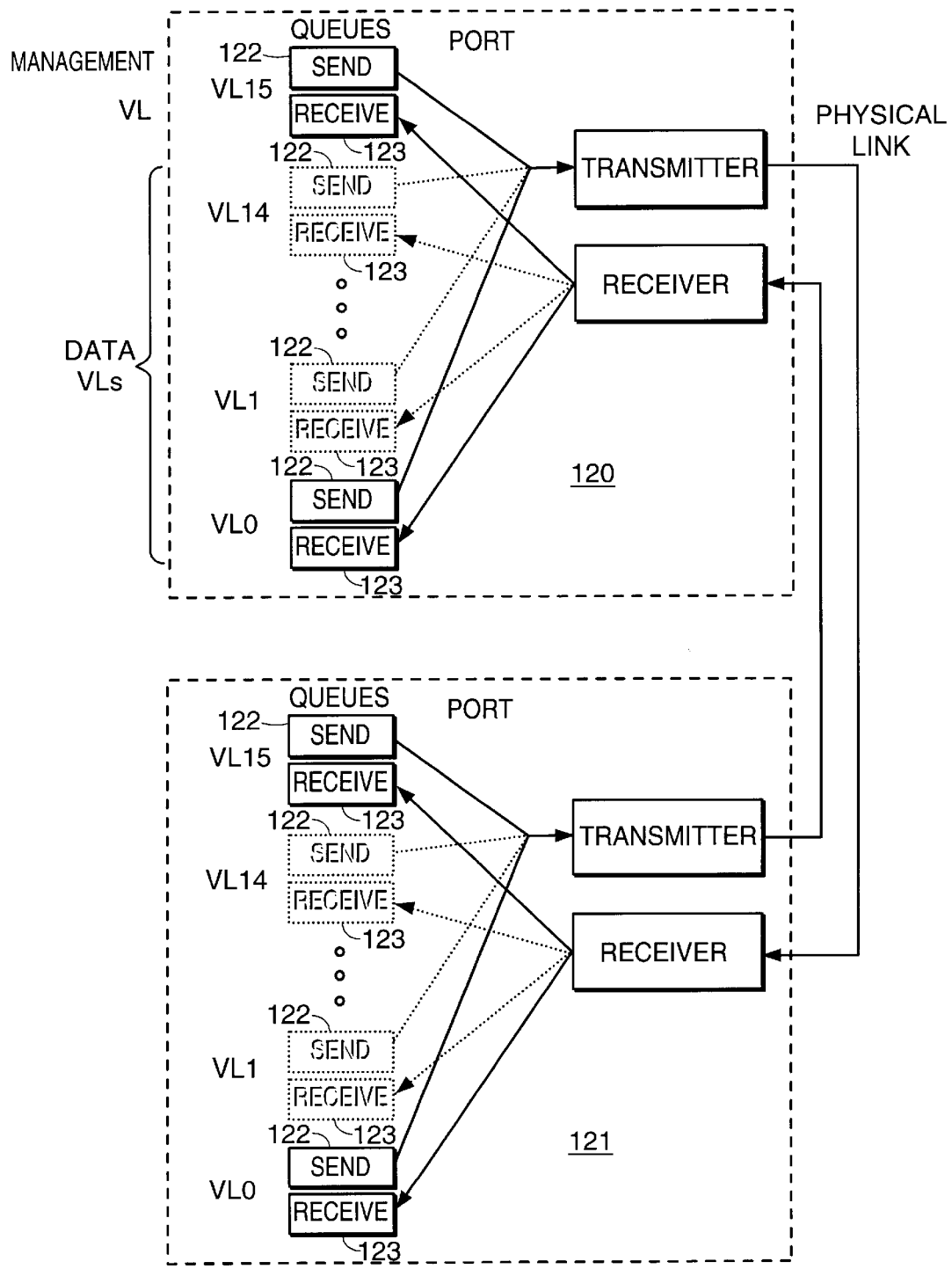
FIG. 1(b) is a block diagram illustrating communication ports used in the system of FIG. 1(a)

Each channel adapter 112 may provide a plurality of queue pairs, each of which provide an independent virtual communication port for a client. Referring now to FIG. 1(b), these virtual communication ports, for example 120 and 121, support a plurality of serial buffering interfaces referred to as virtual lanes. The virtual lanes $VL_o$-$VL_{15}$ are parallel serial lanes and each virtual lane represents a set of send and receive buffers, 122 and 123 respectively, in a port. All ports support sixteen virtual lanes ($VL_o$-$VL_{15}$). The sixteenth lane ($VL_{15}$) is reserved for sub-net management and lanes one through fifteen ($VL_o$-$VL_{14}$) are used for data transmission.

Data is transmitted between the sending device and the receiving device via the virtual lanes $VL_o$-$VL_{14}$ in the form of data packets. A data packet is the unit of information that is routed through the fabric 101. The Infiniband data packet is a 32 bit construct, referred to as a quadlet. The packet contains an invariant clock redundancy check ("ICRC") value, which is a four byte (thirty two bits) quantity. The packet may also contain a variant clock redundancy check ("VCRC") value and a flow control cyclical redundancy ("FCCRC") value, each of which are two byte (sixteen bits) quantities.

The VCRC and FCCRC values are shorter because a packet will only be transmitted a short distance (often only one jump within the fabric 101) before a check might be performed on these values. The data being checked in these packets will be read by a device in the fabric that is close to the source device. The VCRC value may be changed by a switch or router, for example, if the virtual lane designated to transmit the packet changes. Because the packet only travels a short distance before this VCRC value is checked, the probability of errors being created is minimal. The ICRC value, however, is read at the final destination and remains with the data packet throughout the transmission. Consequently, the ICRC value requires a longer polynomial and more stringent cyclical redundancy check.

The Infiniband architecture must be able to handle a number of different link bit rates determined by the number of lanes used to transmit the data bits. The Infiniband data rate is typically 2.5 Gb/sec. Therefore, a×1 (times one) link transmits at 2.5 Gb/sec., a×4 link transmits at 10 Gb/sec. and a×12 link transmits at 30 Gb/sec. Data being transmitted at the ×1 rate is transmitted via the $VL_o$ lane. The ×4 and ×12 link bit rates use $VL_o$-$VL_3$ and $VL_o$-$VL_{11}$ respectively. Calculating the clock redundancy check sum for an ×12 interface requires that the CRC be calculated using a 96 bit data bus. The 96 bit data bus is inherited from the fact that 12 bytes of data, or three quadlets, are simultaneously transmitted oil the ×12 interface. If the device receiving the data operates at the ×12 rate, a CRC check will be performed once every clock cycle. If the device receiving the data operates at the ×4 rate a CRC check will be performed once every three clock cycles, if at the ×1 rate, the check will be performed once every twelve clock cycles.

Figure 2:
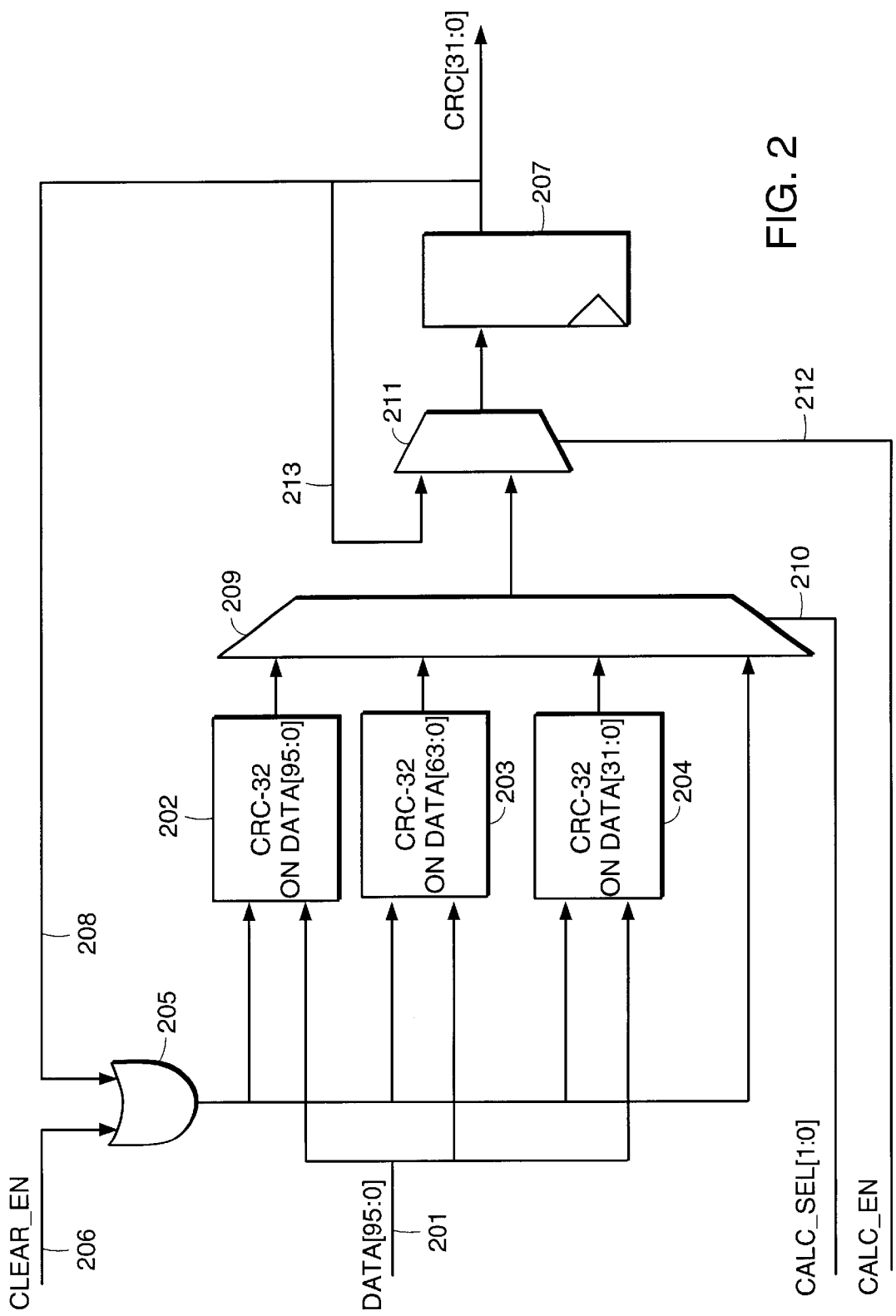
FIG. 2 is block diagram illustrating an apparatus for generating a 32 bit cyclical redundancy check value in accordance with one embodiment of the invention.

FIG. 2 is a block diagram illustrating an apparatus for generating a cyclical redundancy check value for a variable number of input bits. The apparatus is especially useful where the input bits may differ from the full link width. In particular, the apparatus of FIG. 2 generates a CRC value for a data packet containing any number of quadlets. The apparatus includes a data interface, here data bus 201 for transporting bits of input data. In the embodiment shown, the input data bus comprises twelve serial parallel lanes. Data bus 201 carries up to three quadlets or 96 bits of input data. In this illustration, the apparatus will generate a 32 bit cyclical redundancy value for an ICRC. The apparatus includes a first device 202 capable of calculating a first CRC value on the full set of bits of input data (96 bits (3 quadlets)in the embodiment) and a second device 203 capable of calculating a second CRC value on a first subset of the full set of bits of input data (64 bits (2 quadlets)in the embodiment). It is contemplated that there may be embodiments where two such devices is sufficient. For example, if a system allowed for a maximum of eight lanes and the data was sent in quadlets, a first device would calculate for 64 bits and the second device would calculate for 32 bits. In an Infiniband embodiment having twelve lanes, three devices to calculate CRC values is preferred. A third device 204 capable of calculating a third CRC value on a second subset of the first subset of bits (32 bits (1 quadlet) of data in the embodiment) is provided.

A logic gate 205 receives a 4 byte initialization input containing all 1's for an initial CRC calculation on the first set of bits in a data packet. The output of the logic gate 205 is used as a base cyclical redundancy check value which is provided to each of the CRC calculation devices for calculation. The CRC calculation devices use the base CRC value as an intermediate value that is updated by the calculation with the input bits. Logic gate 205 is an OR gate so that on initialization all 1's are the input to the CRC calculation devices. Thereafter, as the remainder of the data packet arrives, the CLEAR-EN input to the logic gate 205 is all zeros. The logic gate 205 is coupled between the CRC calculation devices and a feedback loop 208 from the CRC register 207. Thus, for the rest of the data packet, the logic gate 205 provides the output value from a CRC register 207. The CRC value is cumulatively revised in the CRC register 207 as data in a packet continues to arrive. The value from logic gate 205 is input to each of the calculation devices 202, 203, and 204 along with the data from the data bus 201. The devices 202, 203, and 204 each calculate a 32 bit ICRC value accordingly. The results of the calculations (i.e., a first CRC value, a second CRC value, and a third CRC value) are input to a first multiplexer 209 as is a selection input 210. The selection input can be two bits where there are only four or fewer calculation devices. The selection input serves to select one of the three calculated values for further transmission, depending on the number of quadlets that need to be included in the CRC calculation. In a data packet of at least three quadlets, the first CRC value is selected for the first iteration and thereafter until the final iteration of the CRC calculation for the data packet. In the final iteration, there may be one, two or three quadlets remaining in the data packet. The CRC values are selected accordingly by the first multiplexer 209. For example, a data packet that is made up of seven quadlets of data will in the first iteration take the first calculated value from the device 202 performing the CRC calculation on the full set of bits of input data. In the second iteration, the calculated CRC value in the register 207 is fed back and revised in the first device 202 when calculating CRC on the second full set of three quadlets. In the third and final iteration, only one quadlet remains so the CRC value calculated by the third device 204 acting on the one quadlet and the fed back CRC is selected by the multiplexer 210. This result is the CRC for the seven quadlet data packet.

The CRC value selected in the first multiplexer 209 is input to a second multiplexer 211. The second multiplexer 211 also receives a calculation enable input 212, as well as the output value from the register 207 over feedback loop 213. The calculation enable input 212 serves to hold the output value of the register 207 in the register until all the input data for performing an iteration of the CRC calculation has arrived. When the input data is present, the appropriate calculated CRC value is taken from the first multiplexer 209 and forwarded into the CRC register 207. When the final iteration of the CRC calculation is complete, the CRC value can be taken from the register 207 and appended to the data packet.

Figure 3:
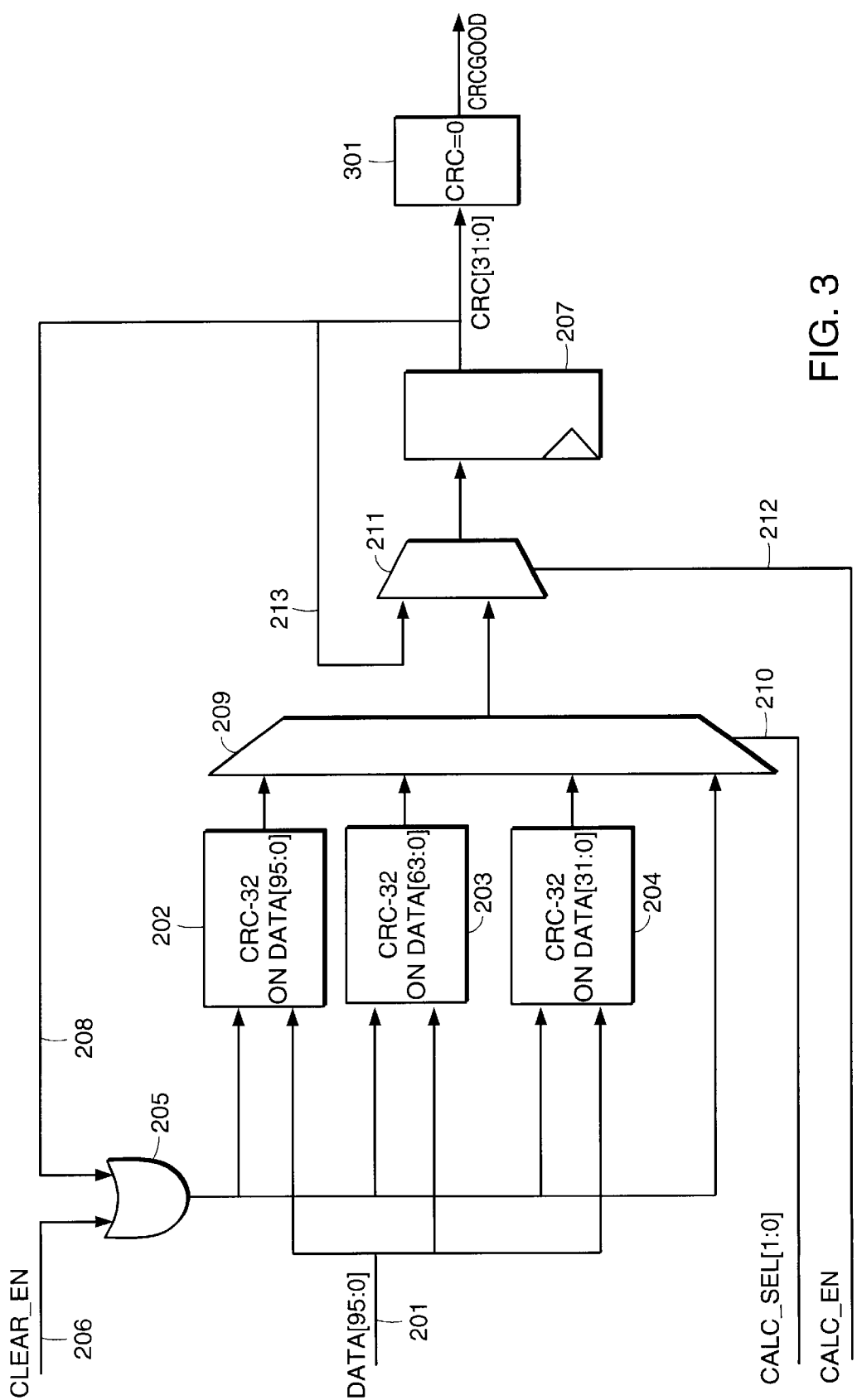
FIG. 3 is a block diagram illustrating an apparatus for checking a 32 bit cyclical redundancy check value in accordance with another embodiment of the invention.

When receiving a data packet with a CRC, to conduct a CRC check on 32 bits of data, an apparatus similar to that shown in FIG. 2 is employed. Referring to FIG. 3, the checking apparatus includes all of the elements of the generator described above as well as a checker 301. The checker 301 reads the final calculated CRC value from the register 207, and compares it to a constant value stored in the checker. In a preferred embodiment, the constant value is all zeroes. In this apparatus, the input CRC value is included in the CRC generation. If the resulting CRC value is equal to the constant, the data has been received without errors. If the two values are different, the data may have to be re-transmitted.

Figure 4:
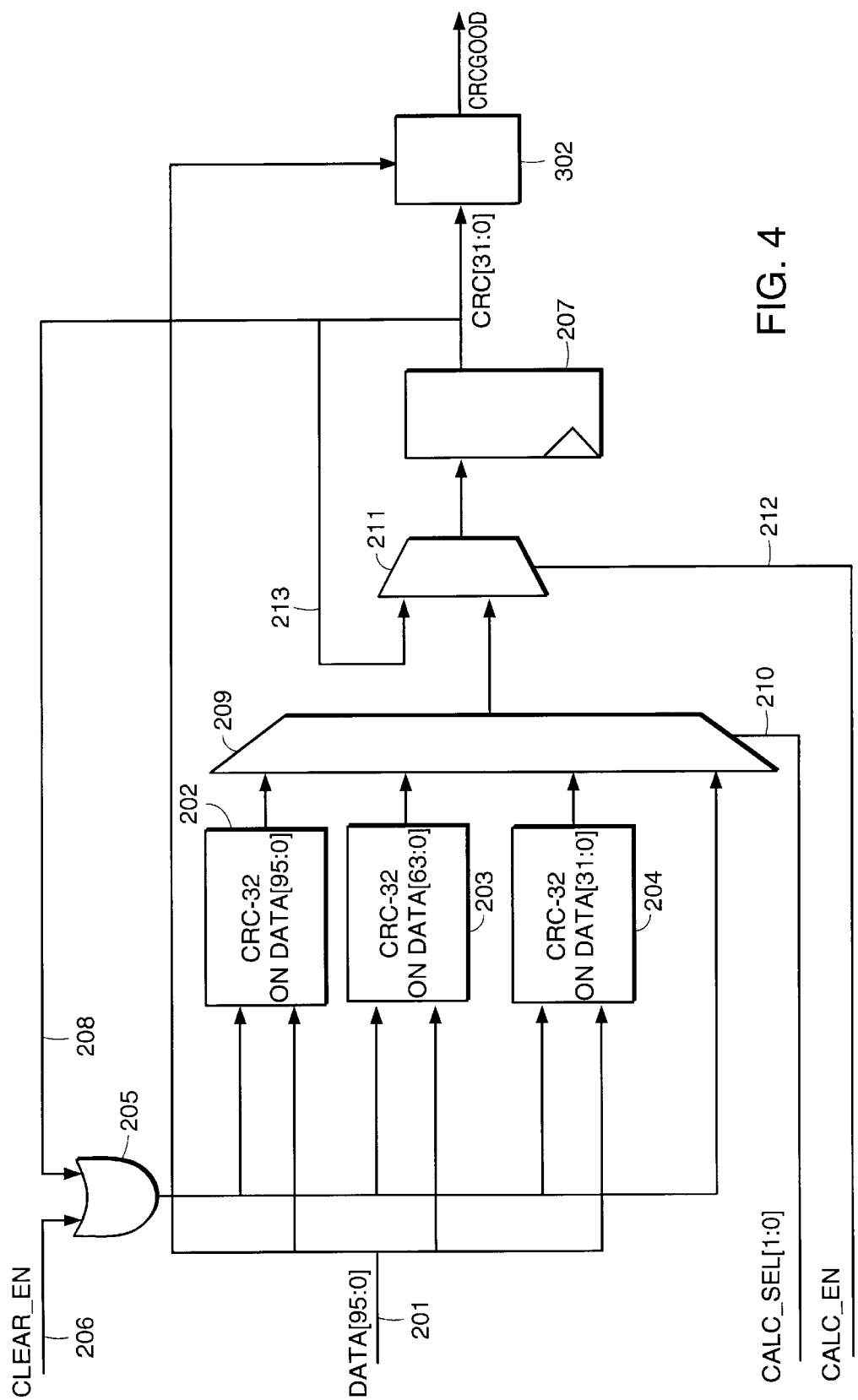
FIG. 4 is a block diagram illustrating an apparatus for checking a 32 bit cyclical redundancy check value in accordance with a further embodiment of the invention.

Another apparatus for performing a CRC check on 32 bits of data is illustrated in FIG. 4. In accordance with this apparatus, the checker is a comparator 302. An original CRC value, the value that is input with the data, is provided to the comparator 302 and compared to the CRC value calculated by the apparatus defined by the elements of FIG. 2. A device (not shown) selects the 32 bit original CRC value for use by the comparator 302. In this embodiment, the CRC value calculation is only performed for the input data not including the original input CRC value. If the original CRC value matches the calculated CRC value, then the data has been received without errors.

Figure 5:
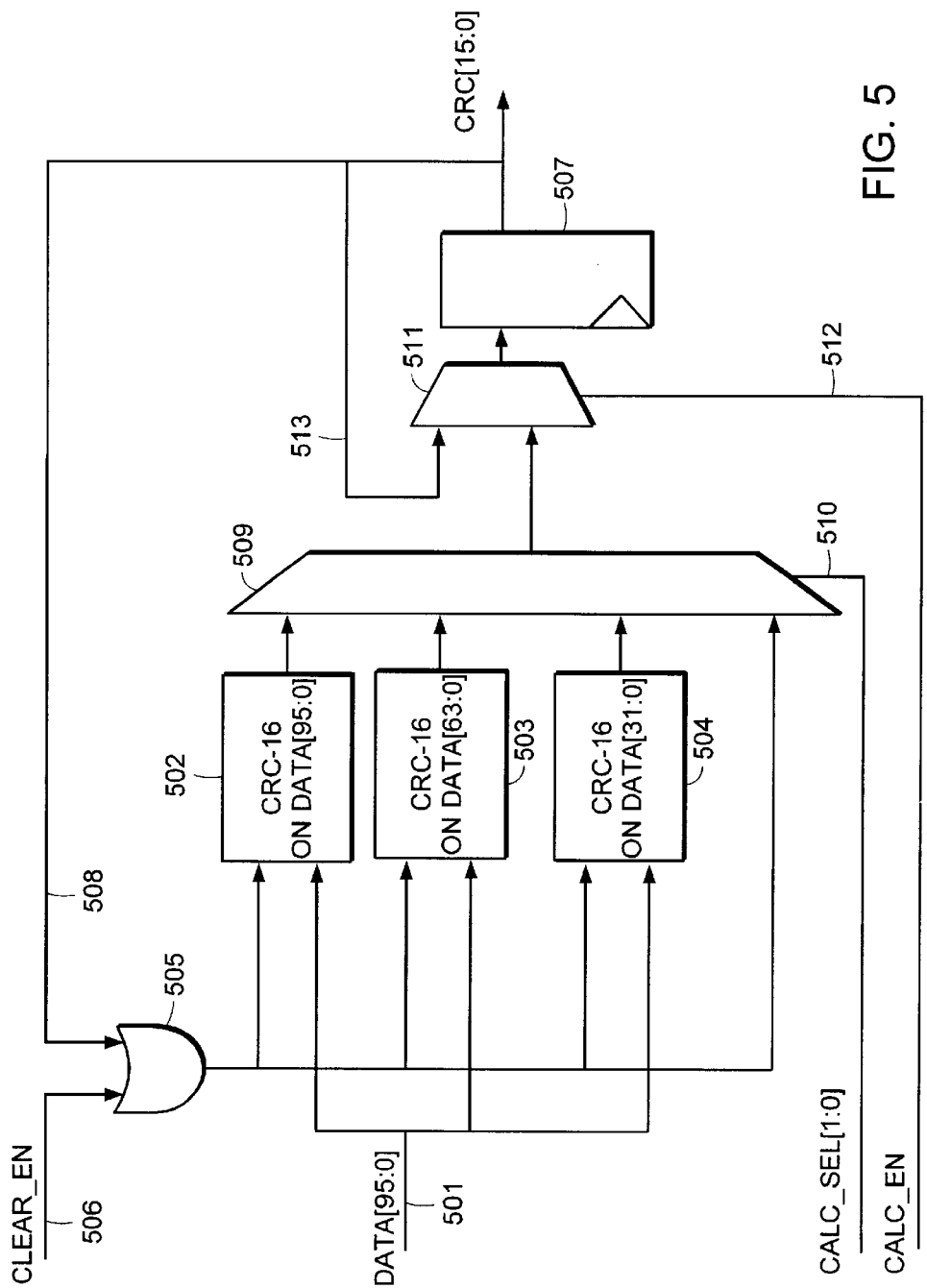
FIG. 5 is a block diagram illustrating an apparatus for generating a 16 bit cyclical redundancy check value in accordance with an embodiment of the invention.

FIG. 5 is a block diagram illustrating an apparatus for generating a 16 bit cyclical redundancy check value to be used as a VCRC or FCCRC value in accordance with an embodiment of the invention. The apparatus includes a data interface 501, similar to that described above with respect to FIG. 2. Similarly, the apparatus also includes a first device 502 for calculating a first CRC value on the total possible bits of input data, 96 in this embodiment, and a second device 503 for calculating a second CRC value on a 64 bit subset of the total input data bits. A third device 504 calculates a CRC value on a 32 bit subset of input data. According to this embodiment, a logic gate 505 receives a 2 byte initialization input containing all 1's via input 506 during an initial iteration of the CRC calculation. The logic gate 505 also receives a 16 bit output value from register 507 over feedback loop 508. The devices 502–504 each calculate a 16 bit value, and the results of the calculations are selected by a first multiplexer 509 in response to two bit selection input 510. Again, the two bit quantity serves to select one of the three calculated value for further transmission, depending on the number of quadlets to be included in the CRC calculation.

The CRC value selected in the first multiplexer 509 is input to a second multiplexer 511, along with the output value from the register 507. A calculation enable input 512 designates either the CRC value selected in the first multiplexer 509 or the output value from the register. When all the input data for an iteration of the CRC calculation has arrived, the calculation enable input 512 selects the calculated CRC value from the first multiplexer 509. Thereafter, it holds the output value of the register 507 in the register until the next iteration is complete.

When receiving a data packet with a 16 bit CRC, a CRC check can be conducted with an apparatus similar to that shown in FIG. 5. By adding a checker that acts as a comparator as was done in FIG. 4, the 16 bit CRC can be generated for the incoming data packet and compared with the original 16 bit CRC value that arrived in the incoming data packet. If the values match, then the data has been received without errors.

Figure 6:
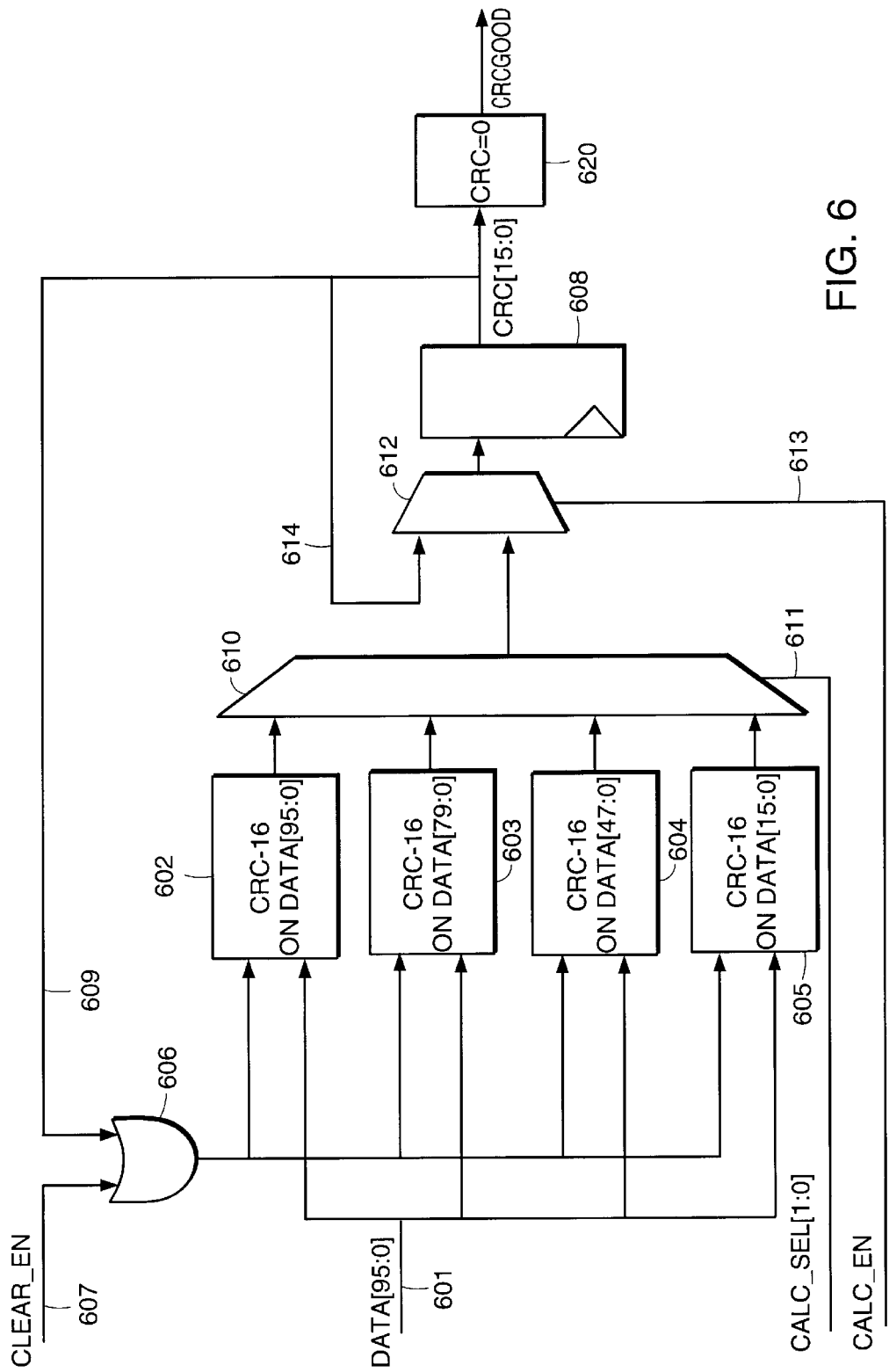
FIG. 6 is a block diagram illustrating an apparatus for checking a 16 bit cyclical redundancy check value in accordance with another embodiment of the invention.

FIG. 6 is a block diagram illustrating an apparatus for checking a 16 bit cyclical redundancy check value in accordance with another embodiment of the invention. The apparatus includes a data interface 601, for receiving data from at least twelve parallel serial lanes. The apparatus also includes a first device 602 for calculating a CRC value on a full set of 96 bits of data (or three quadlets). This apparatus will be used to check a 16 bit CRC that arrives with the data. The CRC will be calculated on the received data including the 16 bit CRC and then compared with a constant. In order to include the 16 bit CRC at the end of a data packet in the CRC calculation, the apparatus includes devices to calculate CRC on a subset of the full set of input data. In particular, a second device 603 for calculating a second CRC value on 80 bits of data (two quadlets plus 16 bits), a third device 604 for calculating a third CRC value on 48 bits of data (one quadlet plus 16 bits), and a fourth device 605 for calculating a fourth CRC value on 16 bits of data, The 16 bits are there so as to be able to include a VCRC or FCCRC value received in the data packet. The logic gate 606 serves the initialization function described above for the CRC generators and feedback the current value of the CRC to the devices for further iterations of the CRC calculation.

The devices, 602, 603, 604, and 605 each calculate a 16 bit CRC The results of the calculations are input to a first multiplexer 610. As above, the two bit selection input serves to select one of the four calculated values for further transmission, depending on the number of quadlets of data involved in the iteration of the CRC calculation. If three quadlets of data were received, the first CRC value is selected. If, however, this is the final iteration of the calculation and 2 quadlets of data remain, the second CRC value is selected to calculate the CRC with the appended incoming 16 bit CRC in addition to the two quadlets. If 1 quadlet of data remains the third CRC value is selected. Finally, if the CRC has been calculated for the entire data packet except for the 16 bit incoming CRC, the fourth CRC value is selected to revise the CRC calculation with the appended 16 bit CRC.

The CRC value selected in the first multiplexer 610 is input to a second multiplexer 612. As was the case with respect to generating a 32 bit CRC value, the second multiplexer 612 also receives a calculation enable input 613. The calculation enable input 613 serves to designate either the CRC value selected in the first multiplexer 610 or the output value from the register. A checker 620 reads the CRC value in the register 608, and compares it to a 16 bit constant value stored in the checker in the same manner as described above in connection with FIG. 3.

Although the embodiments hereinbefore described are preferred, many modifications and refinements which do not depart from the true spirit and scope of the invention may be apparent to those skilled in the art. For example, the invention may be practiced with different numbers of input data bits depending upon the requirements of a given data network.

It is intended that all such modifications, including but not limited to those set forth above, be covered by the following claims.

What is claimed is:

1. An apparatus for generating a cyclical redundancy check value for a variable number of input data bits, the apparatus comprising:
    a first device for calculating a cyclical redundancy check value with a full set of bits of input data and producing a first value;
    a second device for calculating a cyclical redundancy check value with a first subset of the full set of bits of input data and producing a second value;
    a third device for calculating a cyclical redundancy check value on a second subset of the first subset of bits and producing a third value;
    a first multiplexer coupled to the first, second and third devices and having a selection input for selectively outputting one of the values; and
    a register having an input coupled to the output of the multiplexer.

2. An apparatus according to claim 1 wherein the first, second and third devices each have an input coupled to an output from the register.

3. An apparatus for checking a cyclical redundancy check value for a variable number of input data bits comprising the apparatus of claim 1 and further comprising a checker in communication with the register, the checker receiving an output value from the register and comparing the output value to a constant.

4. An apparatus for generating a cyclical redundancy check value for a variable number of input data bits, the apparatus comprising:
    a first device for calculating a cyclical redundancy check value with a full set of bits of input data and producing a first value;
    a second device for calculating a cyclical redundancy check value with a first subset of the full set of bits of input data and producing a second value;
    a first multiplexer coupled to the first and second devices and having a selection input for selectively outputting one of the values;
    a register having an input coupled to the output of the multiplexer and having an output; and
    a logic gate coupled between the output from the register and an input to each of the first and second devices, the logic gate receiving the value in the register and an initialization input to provide the first and second devices with an output value in the register after initialization so that after initialization, the cyclical redundancy check value is calculated in each of the first and second devices with the output value from the register and the respective set of bits of input data.

5. An apparatus for generating a cyclical redundancy check value for a variable number of input data bits, the apparatus comprising:
    a first device for calculating a cyclical redundancy check value with a full set of bits of input data and producing a first value;
    a second device for calculating a cyclical redundancy check value with a first subset of the full set of bits of input data and producing a second value;
    a first multiplexer coupled to the first and second devices and having a selection input for selectively outputting one of the values;
    a register having an input coupled to the output of the multiplexer and having an output coupled to an input of each of the first and second devices; and
    a second multiplexer coupled between the first multiplexer and the register, the second multiplexer connected to receive the selected value from the first multiplexer, an output value from the register and an enable input for selecting the selected value from the first multiplexer or the output value from the register for input into the register.

6. An apparatus for checking a cyclical redundancy check value for a variable number of input data bits comprising:
    a first device for calculating a cyclical redundancy check value with a full set of bits of input data and producing a first value;
    a second device for calculating a cyclical redundancy check value with a first subset of the full set of bits of input data and producing a second value;
    a first multiplexer coupled to the first and second devices and having a selection input for selectively outputting one of the values;
    a register having an input coupled to the output of the multiplexer; and
    a checker connected to receive input data and in communication with the register, the checker receiving and comparing a cyclical redundancy value from within the input data and an output value from the register.

7. An apparatus for generating a cyclical redundancy check value for a variable number of input data bits, the apparatus comprising:
    an input data line;
    a first device for calculating a cyclical redundancy check value with a full set of bits and producing a first value, the first device connected to receive a base cyclical redundancy check value and input data bits from the input data line;
    a second device for calculating a cyclical redundancy check value with a first portion of the full set of bits and producing a second value, the second device connected to receive the base cyclical redundancy check value and input data bits from the input data line;
    a third device for calculating a cyclical redundancy check value with a second portion of the full set of bits and producing a third value, the second portion being a subset of the first portion and the third device connected to receive the base cyclical redundancy check value and input data bits from the input data line;
    a register coupled to the first, second and third devices so as to receive one of the values; and
    a feedback loop making an output value of the register available as the base cyclical redundancy check value.

8. An apparatus according to claim 7 further comprising a first multiplexer coupled to the first, second and third devices and having a selection input for selectively outputting one of the values.

9. An apparatus according to claim 7 further comprising a second multiplexer coupled between the first multiplexer and the register, the second multiplexer connected to receive the selected value from the first multiplexer, the output value of the register and an enable input for selecting the selected value from the first multiplexer or the output value of the register for input into the register.

10. An apparatus for checking a cyclical redundancy check value for a variable number of input data bits comprising the apparatus of claim 7 and further comprising a checker in communication with the register, the checker receiving and comparing a cyclical redundancy value from within the input data and the output value from the register.

11. An apparatus for checking a cyclical redundancy check value for a variable number of input data bits comprising the apparatus of claim 7, and further comprising a checker in communication with the register, the checker receiving the output value from the register and comparing the output value to a constant.

12. An apparatus according to claim 7, further comprising a fourth device for calculating a cyclical redundancy check value on a third portion of the full set of bits and producing a fourth value, the third portion being a subset of the second portion and the fourth device connected to receive the base cyclical redundancy check value and input data bits from the input data line.

13. An apparatus according to claim 7 further comprising a logic gate coupled between the feedback loop from the register and the first, second and third devices, the logic gate receiving the output value from the register and an initialization input to provide the first, second and third devices with the output value in the register after initialization so that after initialization, the cyclical redundancy check value is calculated with the output value from the register and the input data bits.

14. A method for generating a cyclical redundancy check value for a variable number of input data bits, the method comprising:

receiving the variable number of input data bits;

calculating a cyclical redundancy check value with a total number of bits and producing a first calculated value;

calculating a cyclical redundancy check value with a first subset of the total number of bits and producing a second calculated value;

calculating a cyclical redundancy check value on a second subset of the first subset of bits and producing a third value;

selecting one of the calculated values; and transmitting the selected value to a register.

15. A method according to claim 14 further comprising feeding back an output value from the register, calculating the cyclical redundancy check value with the total number of bits and the output value from the register to produce the first calculated value, and calculating the cyclical redundancy check value with the first subset of the total number of bits and the output value from the register to produce the second calculated value.

16. A method according to claim 15 further comprising selecting the selected calculated value for input to the register when the total number of input data bits have been received for calculation of the cyclical redundancy check values.

17. A method according to claim 15 further comprising selecting the selected calculated value for input to the register when a last of the variable number of input data bits required for cyclical redundancy check calculation has been received.

18. A method according to claim 15 further comprising selecting the output value from the register for input to the register when none of the calculated values are ready for selection.

19. A method for checking a cyclical redundancy check value for a variable number of input data bits comprising the method of claim 14 and further comprising comparing an input cyclical redundancy value from the variable number of input data bits with the output value from the register.

20. A method for checking a cyclical redundancy check value for a variable number of input data bits comprising the method of claim 14 and further comprising comparing the output value from the register with a constant.

* * * * *